(12) United States Patent
Wang et al.

(10) Patent No.: US 12,232,254 B2
(45) Date of Patent: Feb. 18, 2025

(54) PRINTED CIRCUIT BOARD AND MANUFACTURING METHOD THEREOF

(71) Applicant: Unimicron Technology Corporation, Taoyuan (TW)

(72) Inventors: Po-Hsiang Wang, Taoyuan (TW); Ming-Hao Wu, Taoyuan (TW)

(73) Assignee: Unimicron Technology Corporation, Taoyuan (TW)

( * ) Notice: Subject to any disclaimer, the term of this patent is extended or adjusted under 35 U.S.C. 154(b) by 225 days.

(21) Appl. No.: 17/879,920

(22) Filed: Aug. 3, 2022

(65) Prior Publication Data
US 2023/0413430 A1    Dec. 21, 2023

(30) Foreign Application Priority Data

Jun. 17, 2022 (TW) .................................. 111122549

(51) Int. Cl.
*H05K 1/02* (2006.01)
*H05K 1/09* (2006.01)
(Continued)

(52) U.S. Cl.
CPC ........... *H05K 1/0298* (2013.01); *H05K 1/092* (2013.01); *H05K 3/0017* (2013.01); *H05K 3/26* (2013.01);
(Continued)

(58) Field of Classification Search
CPC ........ H05K 1/0298; H05K 1/092; H05K 1/02; H05K 1/09; H05K 2201/09227;
(Continued)

(56) References Cited

U.S. PATENT DOCUMENTS

| 6,555,427 B1 * | 4/2003 | Shimizu | H10B 41/30 365/185.26 |
| 10,607,915 B2 | 3/2020 | Oohiraki et al. | |

(Continued)

FOREIGN PATENT DOCUMENTS

| CN | 105228343 A  * | 1/2016 | ............. H05K 1/117 |
| CN | 110493968 A  * | 11/2019 | ............... H05K 3/06 |

(Continued)

OTHER PUBLICATIONS

The Influence of the PCB Design_Vasilyev et al_pp. 91-96_Mar. 2021.*

(Continued)

*Primary Examiner* — Timothy J Thompson
*Assistant Examiner* — Guillermo J Egoavil
(74) *Attorney, Agent, or Firm* — Best & Flanagan LLP

(57) ABSTRACT

The present disclosure provides a printed circuit board and a method thereof. The printed circuit board has a first substrate, at least one first trace layer and at least one second trace layer. The first substrate has a first surface and a second surface. The first surface and the second surface are corresponding to each other along an axis. The first trace layer is formed on the first surface and/or the second surface of the first substrate. The first trace layer has at least one first trace and at least one first gap beside the first trace by etching. The second trace layer is formed on the first trace layer. The second trace layer has at least one second trace and at least one second gap beside the second trace by etching.

10 Claims, 10 Drawing Sheets

(51) Int. Cl.
    *H05K 3/00* (2006.01)
    *H05K 3/26* (2006.01)
    *H05K 3/32* (2006.01)
    *H05K 3/46* (2006.01)
(52) U.S. Cl.
    CPC ........... *H05K 3/321* (2013.01); *H05K 3/4664* (2013.01); *H05K 2201/09227* (2013.01)
(58) Field of Classification Search
    CPC ..... H05K 2201/096; H05K 2203/1476; H05K 3/0017; H05K 3/06; H05K 3/24; H05K 3/26; H05K 3/321; H05K 3/4647; H05K 3/4652; H05K 3/4664; H05K 3/00; H05K 3/32; H05K 3/46
    USPC .......................................................... 174/250
    See application file for complete search history.

(56) References Cited

U.S. PATENT DOCUMENTS

| | | | |
|---|---|---|---|
| 10,658,282 B2 | 5/2020 | Ko et al. | |
| 11,234,331 B2 | 1/2022 | Li et al. | |
| 2013/0001186 A1* | 1/2013 | Sakaguchi | C23F 1/26 |
| | | | 216/13 |
| 2013/0161073 A1* | 6/2013 | Lee | H05K 3/4644 |
| | | | 29/830 |
| 2013/0319841 A1* | 12/2013 | Chao | G06F 3/041 |
| | | | 977/956 |
| 2017/0154873 A1* | 6/2017 | Kim | H01L 24/73 |
| 2018/0358572 A1* | 12/2018 | Harada | H10K 50/15 |
| 2020/0084876 A1* | 3/2020 | Engler | H05K 3/3452 |
| 2021/0337665 A1* | 10/2021 | Li | H05K 3/02 |
| 2021/0410294 A1* | 12/2021 | Li | H05K 3/3452 |
| 2022/0018036 A1 | 1/2022 | Banik, II et al. | |
| 2022/0330437 A1* | 10/2022 | Li | H05K 1/0216 |

FOREIGN PATENT DOCUMENTS

| | | | | |
|---|---|---|---|---|
| CN | 113543465 A | | 10/2021 | |
| CN | 113630977 A | * | 11/2021 | ............... H05K 1/11 |
| TW | I697078 B | | 6/2020 | |

OTHER PUBLICATIONS

Chien-Min Liu et al., Low-temperature direct copper-to-copper bonding enabled by creep on (111) surfaces of nanotwinned Cu, Scientific Reports, May 12, 2015, pp. 1-11, 5, 9734; doi: 10.1038/srep09734 (2015), www.nature.com/scientificreports/.

* cited by examiner

PRINTED CIRCUIT BOARD AND MANUFACTURING METHOD THEREOF

TECHNICAL FIELD

The present disclosure is in related to a printed circuit board and a manufacturing method thereof, more particularly to a printed circuit board with the traces of a higher etching factor and a method to manufacture the printed circuit board.

BACKGROUND

The thick copper printed circuit board is defined as that the traces of a printed circuit board are thicker than those of a general printed circuit board. The demands for the thick copper printed circuit boards used in products with high heat dissipation and high current are increasing as well. Nowadays, the thick copper printed circuit boards are generally produced by multiple-times etching methods. Because of the copper layer being etched for many times, not only the productivity is reduced, but the etching factor may be smaller. Moreover, the small etching factor will affect the layout of the circuit design as well as that easily happen tip discharge on the wires in the inner layer of the printed circuit board, which may cause short circuit or insulation damage.

Thus, how to manufacture a printed circuit board with the traces of a higher etching factor becomes an issue to a person having ordinary skill in the art.

SUMMARY

The main object of the present disclosure is to provide a printed circuit board and a method thereof, in order to let traces of the printed circuit board have a higher etching factor.

According to the above-mentioned and other objects, the present disclosure provides a printed circuit board, which has a first substrate, at least one first circuit layer and at least one second circuit layer. The first substrate has a first surface and a second surface, the first surface and the second surface are corresponding to each other along an axis. The first circuit layer is formed on the first surface and/or the second surface of the first substrate, the first circuit layer has at least one first trace and at least one first gap beside the first trace by etching, wherein an etching factor of the first trace is greater than or equal to 2.3. The second circuit layer is formed on the first circuit layer, the second circuit layer has at least one second trace and at least one second gap beside the second trace by etching, wherein an etching factor of the second trace is greater than or equal to 2.3, wherein the first trace and the second trace are connected with each other along the axis in order to form a stacked trace, and an etching factor of the stacked trace is greater than or equal to 4.6.

According to above-mentioned and other objects, the present disclosure provides a method for manufacturing a printed circuit board, and the method comprises steps of:
providing a first substrate having a first surface and a second surface, the first surface and the second surface being corresponding to each other along an axis;
providing at least one first circuit layer formed on the first surface and/or the second surface of the first substrate, wherein the first circuit layer has at least one first trace and at least one first gap beside the first trace by etching, wherein an etching factor of the first trace is greater than or equal to 2.3;
forming at least one second circuit layer on the first circuit layer, wherein the second circuit layer has at least one second trace and at least one second gap beside the second trace by etching, wherein an etching factor of the second trace is greater than or equal to 2.3; and
forming a stacked trace by way of the first trace and the second trace being connected with each other along the axis, and an etching factor of the stacked trace being greater than or equal to 4.6.

In some embodiment, a low-temperature Cu—Cu direct bonding technique is applied to a connection of the first trace and the second trace.

In some embodiment, the first trace and the second trace are connected with each other via a conductive glue.

In some embodiment, the first gap and the second gap are through to each other along the axis, and the first gap and the second gap are filled with a dielectric material.

In some embodiment, a planarization technique is included to apply to the connection of the first trace and the second trace.

In some embodiment, the planarization technique is a chemical mechanical polishing technique.

In some embodiment, an outer surface of the second circuit layer and/or the stacked trace forms a solder mask ink.

In some embodiment, the second circuit layer is disposed on a surface of a second substrate.

Accordingly, while manufacturing the printed circuit board of the present disclosure, since the conductive layers are etched individually, the printed circuit board with the traces of a higher etching factor is thus obtained.

The accompanying drawings are incorporated in and constitute a part of this application and, together with the description, serve to explain the principles of the disclosure in general terms. Like numerals refer to like parts throughout the disclosure.

BRIEF DESCRIPTION OF THE DRAWINGS

The objects, spirits, and advantages of the preferred embodiments of the present disclosure will be readily understood by the accompanying drawings and detailed descriptions, wherein.

DETAILED DESCRIPTION

In order to describe in detail the technical content, structural features, achieved objectives and effects of the instant application, the following detailed descriptions are given in conjunction with the drawings and specific embodiments. It should be understood that these embodiments are only used to illustrate the application and not to limit the scope of the instant application.

Figure 1A:
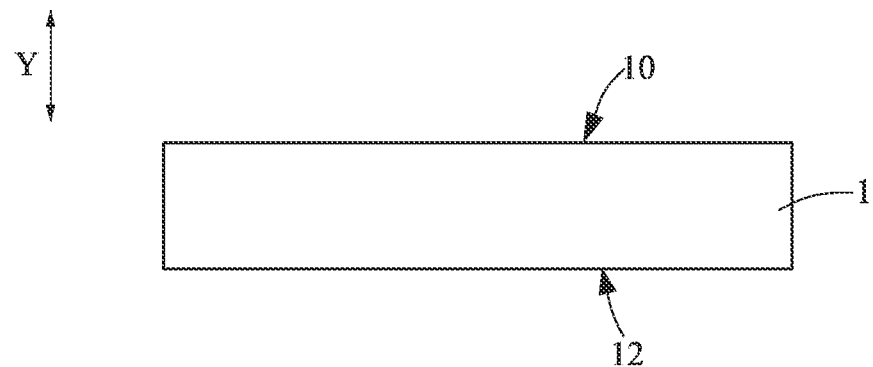
FIG. 1A to FIG. 1G illustrate schematic views of a first embodiment of a method for manufacturing a printed circuit board of the present disclosure.

From FIG. 1A to FIG. 1G, which illustrates a first embodiment of a method for manufacturing a printed circuit board of the present disclosure. As shown in FIG. 1A, a first substrate 1 is provided, and the first substrate 1 has a first surface 10 and a second surface 12, and the first surface 10 and the second surface 12 are corresponding to each other along a Y-axis. As aforesaid, the first surface 10 and the second surface 12 being corresponding to each other along the Y-axis means the first surface 10 and the second surface 12 being not the same height on the Y-axis, and the directions of the first surface 10 and the second surface 12 being opposite to each other. In this embodiment, the first substrate 1 is, for example, a polypropylene substrate. However, in other embodiments, the first substrate 1 can be a polyimide substrate, a polymethyl methacrylate substrate, a glass substrate, a ceramic substrate, or an insulating silicon substrate as well.

Figure 1B:
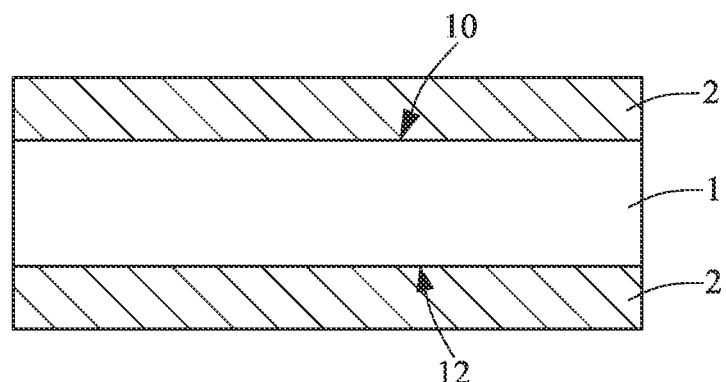

Referring to FIG. 1B, the first surface 10 and the second surface 12 of the first substrate 1 form a first circuit layer 2 respectively. For the embodiment, the material of the first circuit layer 2 is copper, but in other embodiments, the material of the first circuit layer 2 can also be other conductive materials, such as aluminum. In addition, the first circuit layer 2 only forms either on the first surface 10 or the second surface 12 for other embodiments.

Figure 1C:
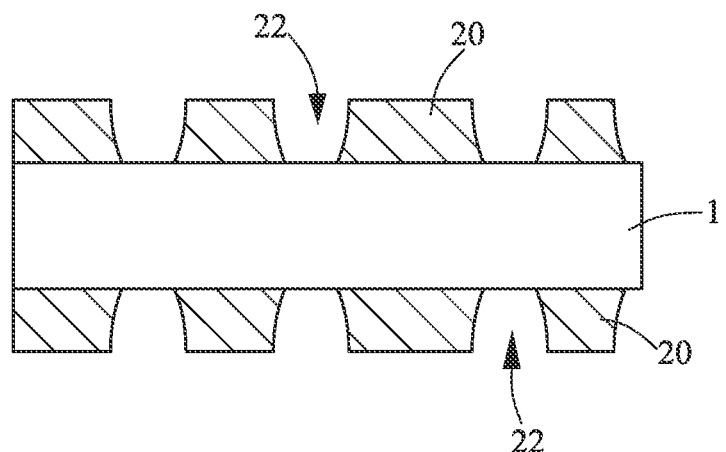

According to FIG. 1C, an etching process, such as wet etching, is applied to the first circuit layer 2, so as to form a plurality of first traces 20. After the etching process, a first gap 22 is formed via etching and beside the first trace 20. The dimensions or width of the first gap 22 is tapered toward the substrate 1, and the first gap 22 exposes the surfaces, the first surface 10 and the second surface 12, of the first substrate 1. For the embodiment, an etching factor of the first trace 20 is greater than or equal to 2.3. That is, the etching factor of a wall of the first gap 22 is greater than or equal to 2.3. The definition of the etching factor of the present disclosure is 2*an etched thickness/(the lower width of an etched layer—the upper width of the etched layer). For instance, The definition of the etching factor of the first trace 20 is 2*the thickness of the first trace 20/(the lower width of the first trace 20—the upper width of the first trace 20). More, the etching factor is also defined as that of the thickness of an etched layer/the undercut of a wall.

Figure 1D:
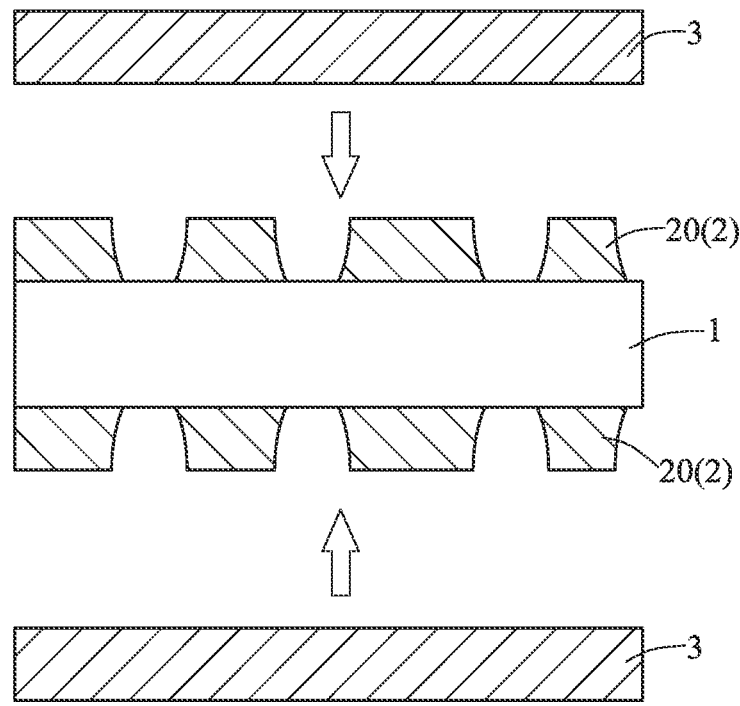
Figure 1E:
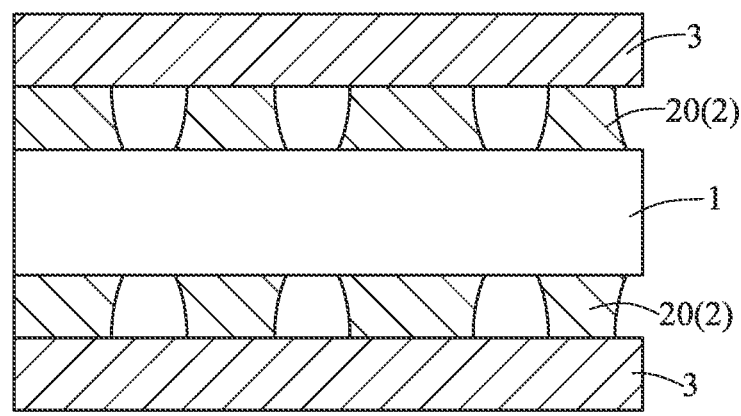

With reference to FIG. 1D and FIG. 1E, at least one second circuit layer 3 is provided and stacked on the first circuit layer 2 with the plurality of first traces 20. As shown in FIG. 1D, the directions of the two arrows are the directions of stacking the second circuit layers 3. In the embodiment, the second circuit layers 3 is a metal plate with the material of copper. Before stacking the second circuit layer 3 on the first circuit layer 2, both the surfaces of the second circuit layer 3 and the first circuit layer 2 are treated by a planarization technique, which is a chemical mechanical polishing technique.

According to FIG. 1E, a low-temperature Cu—Cu direct bonding technique is applied to a connection of the first trace 20 and the second trace 30. For the low-temperature Cu—Cu direct bonding technique, please refer to the following information. Chien-Min Liu, Han-Wen Lin, Yi-Sa Huang, Yi-Cheng Chu, Chih Chen, Dian-Rong Lyu, Kuan-Neng Chen & King-Ning Tu. (2015). Low-temperature direct copper-to-copper bonding enabled by creep on (111) surfaces ofnanotwinned Cu. Scientific Reports, 5:09734. doi: 10.1038/srep09734.

The lowest temperature of Cu—Cu direct bonding is 150° C., and the spending time is 1 hour. If the temperature is up to 250° C., the spending time is 10 minutes. In the field of printed circuit board, the working temperature is generally less than 200° C. Accordingly, the range of the working temperature is between 190° C. and 200° C. for the embodiment.

Figure 1F:
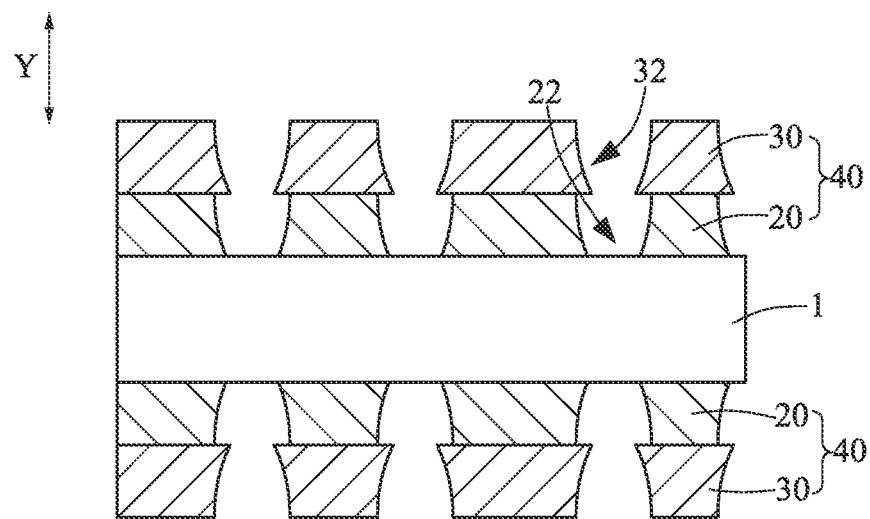

As for FIG. 1F, an etching process is applied to the second circuit layer 3 in order to form a plurality of second traces 30. After the etching process, a plurality of second gaps 32 are beside the second traces 30 and formed by etching. For the embodiment, the second gap 32 penetrates through the second circuit layer 3, and the first gap 22 and the second gap 32 are through to each other. Further, the dimensions or width of the second gaps 32 is tapered from a side that is far from the first gap 22 to another side that is close to the first gap 22. An etching factor of the second trace 30 is greater than or equal to 2.3. That is, the etching factor of a wall of the second gap 32 is greater than and equal to 2.3. Since the etching factors of the first trace 20 and the second trace 30 are greater than or equal to 2.3, the etching factor of a stacked trace 40, connecting the first trace 20 and the second trace 30 along the Y-axis, is greater than or equal to 4.6. Besides, in the embodiment or other embodiments, the first gap 22 and the second gap 32 can be a hole or a line spacing among the traces.

It is to be noted that the steps from FIG. 1D to FIG. 1F may be repeated, so as to produce stacked traces 40 with higher etching factors. For example, the second trace 30 can be stacked one more conductive layer, then etching it in order to gain a new stacked trace 40 with higher etching factor.

Figure 1G:
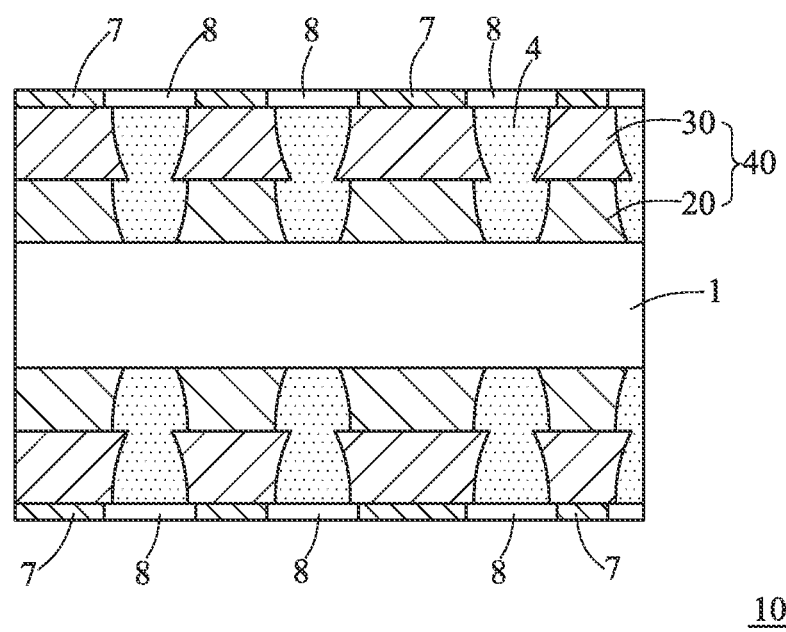

As shown in FIG. 1G, the first gaps 22 and the second gaps 32 are filled with a dielectric material 4, which can be resin, epoxy resin, solder mask or other adhesive materials. The dielectric material 4 is beneficial to avoid shorts among stacked traces 40 or isolation breaking. In the embodiment, after filling out the dielectric material 4, a surface treatment process is applied to two outer surface of the dielectric material 4 and the stacked trace 40, precisely in the second circuit layer 3. The surface treatment process is to coat a surface protection layer 7 and a solder mask ink 8, wherein the surface protection layer 7 is on the stacked trace 40, the solder mask ink 8 is on the dielectric material 4 and covers partial surface of the stacked trace 40. The surface protection layer 7 is to protect the stacked trace 40 and can be the materials of ENEPIG, organic solderability preservatives (OSP), or Electroless Nickel Immersion Gold (ENIG), but not limit thereto.

According to aforesaid, the printed circuit board 100 is completely produced, and the trace (the stacked trace 40) of the printed circuit board 100 is with a higher etching factor. In the manufacturing processes of the printed circuit board 100, the etching process is applied to every conductive layer, such as the first circuit layer 2 and the second circuit layer 3, so as to gain the printed circuit board 100 with the traces of a higher etching factor.

Figure 2A:
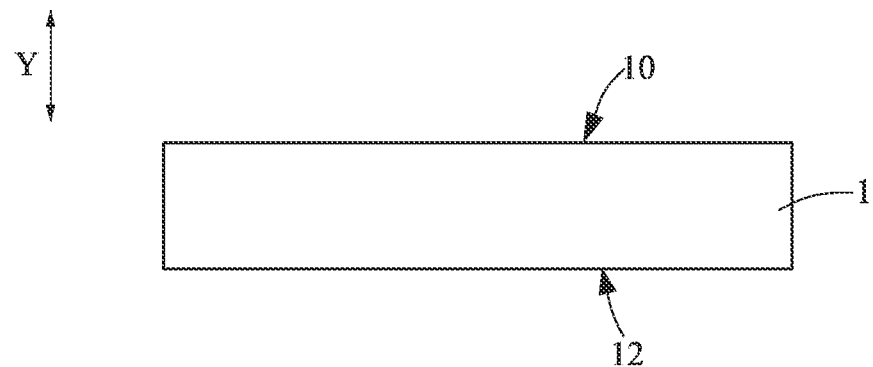
FIG. 2A to FIG. 2F illustrate schematic views of a second embodiment of the method for manufacturing the printed circuit board of the present disclosure.
Figure 2B:
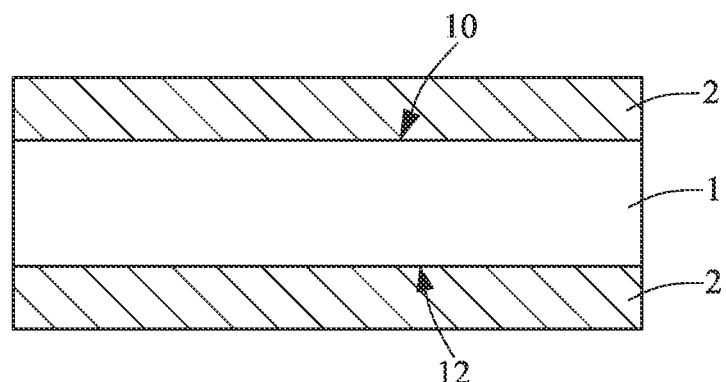
Figure 2C:
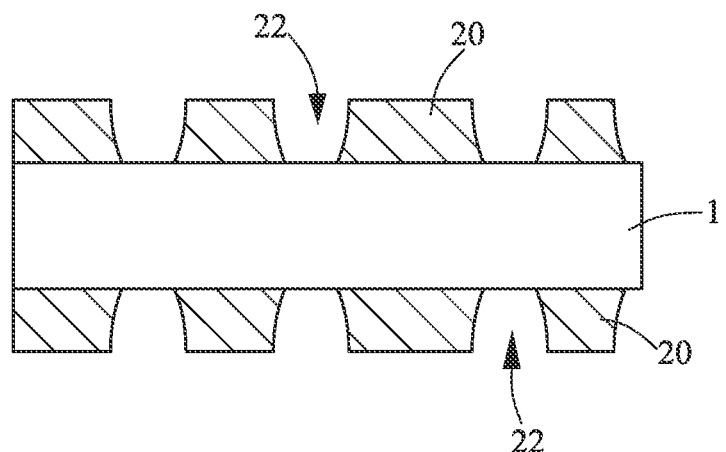
Figure 2D:
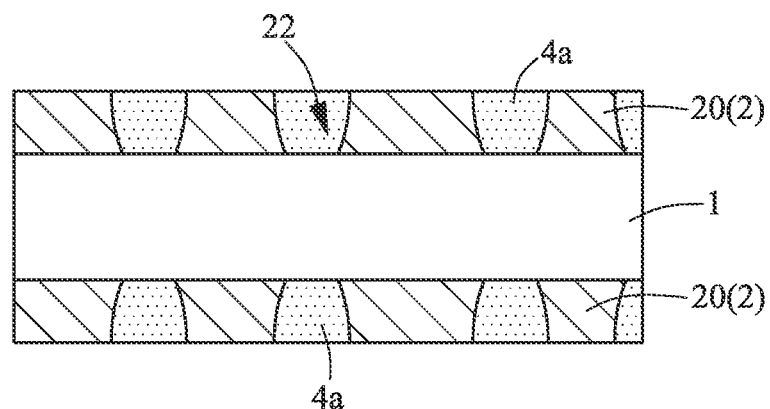

Following will be the descriptions for the second embodiment of the method for manufacturing the printed circuit board, please refer to FIG. 2A to FIG. 2F. In the second embodiment, the same or similar components as those of the first embodiment will be designated with the same reference numerals. According to FIG. 2A, a first substrate 1 is provided, and the first substrate 1 has a first surface 10 and a second surface 12, and the first surface 10 and the second surface 12 are corresponding to each other along a Y-axis. Referring to FIG. 2B, a first circuit layer 2 is formed on the first surface 10 and the second surface 12 of the first substrate 1 respectively. Please refer to FIG. 2C, an etching process is applied to the first circuit layer 2 in order to form a plurality of first traces 20. After the etching process, a first gap 22 is formed by etching and beside the first trace 20, and the first gap 22 exposes the surfaces (the first surface 10 and the second surface 12) of the first substrate 1. For the embodiment, an etching factor of the first trace 20 is greater than or equal to 2.3. That is, the etching factor of a wall of the first gap 22 is greater than or equal to 2.3. The first circuit layer 2 with the plurality of first traces 20 is treated by a planarization technique, which is a chemical mechanical polishing technique for the embodiment. Continuously referring to FIG. 2D, the first gap 22 is filled with a dielectric material 4a.

Figure 2E:
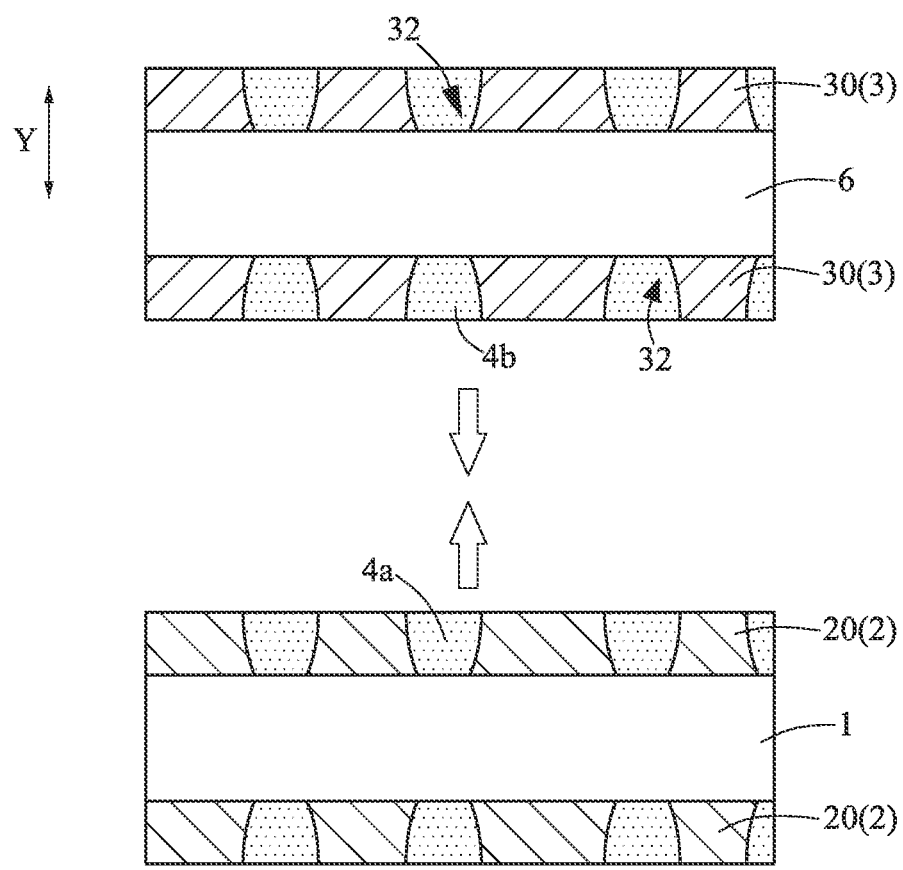

With reference to FIG. 2E, a second substrate 6 is provided, and a second circuit layer 3 is formed on two surfaces of the second substrate 6 respectively, wherein the two surfaces are corresponding to each other. In addition, the second circuit layer 3 has a plurality of second traces 30 formed by etching, and a second gap 32 is beside the second trace 30 and made by etching, wherein an etching factor of the second trace 30 is greater than or equal to 2.3. The second gap 32 is filled with a dielectric material 4b. For the embodiment, the method for forming the second trace 30, the second gap 32 and the dielectric material 4b on the second substrate 6 is the same as the method for forming the first trace 20, the first gap 22 and the dielectric material 4a on the first substrate 1. Therefore, the descriptions for forming the second trace 30, the second gap 32 and the dielectric material 4b may not be discussed any further hereinafter.

Figure 2F:
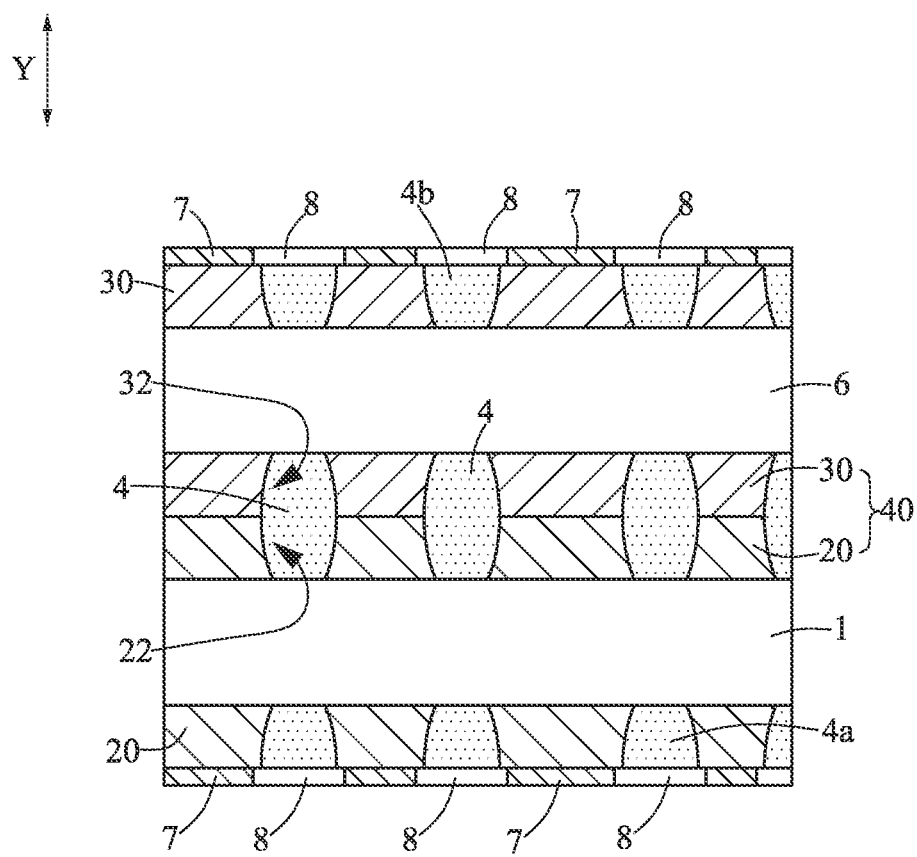

Referring to FIG. 2E, the second trace 30 on one of the two surfaces of the second substrate 6 is connected with the first trace 20 on one of the two surfaces of the first substrate 1 along the Y-axis. The first gap 22 and the second gap 32 are corresponding to each other while in connection. That is to say, the first gap 22 and the second gap 32 are through to each other along the Y-axis after connection, as shown in FIG. 2F. Further, the first trace 20 and the second trace 30 are corresponding to each other as well. There is one thing that must be noted, a planarization technique is applied to the surface of the second trace 30, and the planarization technique is a chemical mechanical polishing technique. As for the present embodiment, a low-temperature Cu—Cu direct bonding technique is applied to the connection of the first trace 20 and the second trace 30.

In accordance with FIG. 2F, the second trace 30 is combined with the first trace 20 to form a stacked trace 40. Since the etching factors of the first trace 20 and the second trace 30 both are greater than or equal to 2.3, the etching factor of the stacked trace 40, connecting the first trace 20 and the second trace 30 along the Y-axis, is greater than or equal to 4.6 as well. After producing the stacked trace 40, an outer surface of the second trace 30 of another outer surface of the second substrate 6 and an outer surface of the first trace 20 of another outer surface of the first substrate 1 can also be applied by a surface treatment process. For the embodiment, the surface treatment process is to add a surface protection layer 7 and a solder mask ink 8, wherein the surface protection layer 7 is on the first trace 20 and the second trace 30, in order to protect them. The solder mask ink 8 is disposed on the dielectric material 4a and the dielectric material 4b, wherein the solder mask ink 8 covers the partial first trace 20 and the partial second trace 30.

According to aforesaid, the printed circuit board 200 is completely produced, and the trace (the stacked trace 40) of the printed circuit board 200 is with a higher etching factor. Compared with the first embodiment, the second embodiment adopts that of etching the second circuit layer 3 first and then combining the second circuit layer 3 with the first circuit layer 2. Since the two conductive layers (the first circuit layer 2 and the second circuit layer 3) are etched individually, the printed circuit board 200 with the traces of a higher etching factor is obtained.

Figure 3A:
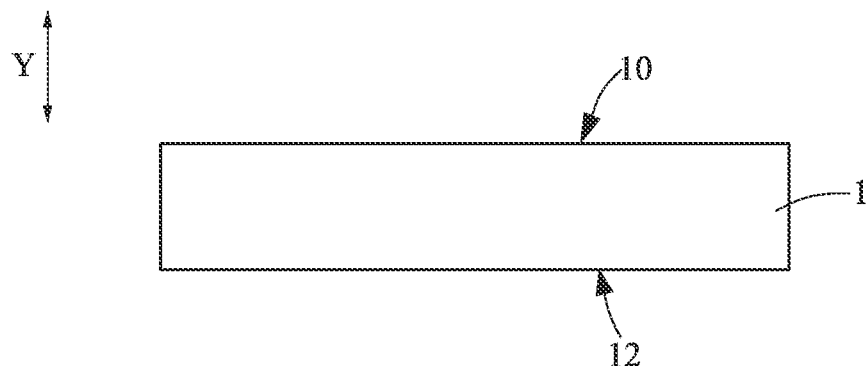
FIG. 3A to FIG. 3H illustrate schematic views of a third embodiment of the method for manufacturing the printed circuit board of the present disclosure.
Figure 3B:
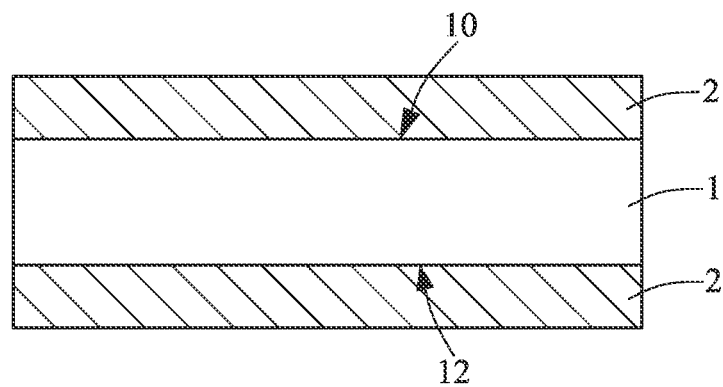
Figure 3C:
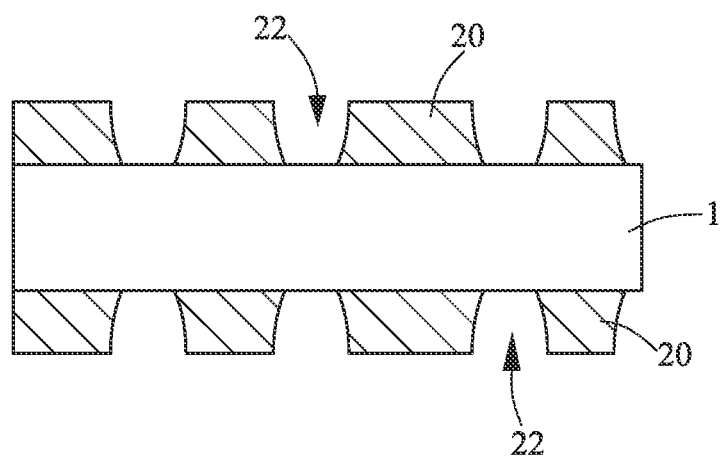
Figure 3D:
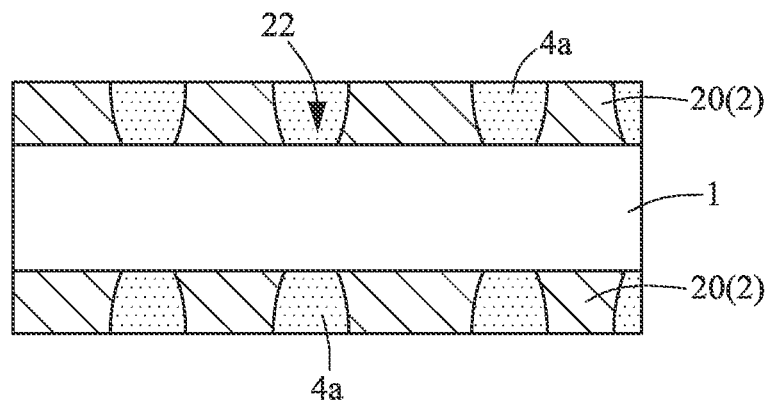

Following will be the descriptions for the third embodiment of the method for manufacturing the printed circuit board, please refer to FIG. 3A to FIG. 3H. In the third embodiment, the same or similar components as those of the second embodiment will be designated with the same reference numerals. According to FIG. 3A, a first substrate 1 is provided, and the first substrate 1 has a first surface 10 and a second surface 12, and the first surface 10 and the second surface 12 are corresponding to each other along a Y-axis. Referring to FIG. 3B, a first circuit layer 2 is formed on the first surface 10 and the second surface 12 of the first substrate 1 respectively. Please refer to FIG. 3C, an etching process is applied to the first circuit layer 2 in order to form a plurality of first traces 20. After the etching process, a first gap 22 is formed by etching and beside the first trace 20, and the first gap 22 exposes the surfaces (the first surface 10 and the second surface 12) of the first substrate 1. For the third embodiment, an etching factor of the first trace 20 is greater than or equal to 2.3. That is, the etching factor of a wall of the first gap 22 is greater than or equal to 2.3. Continuously referring to FIG. 3D, the first gap 22 is filled with a dielectric material 4a.

Figure 3E:
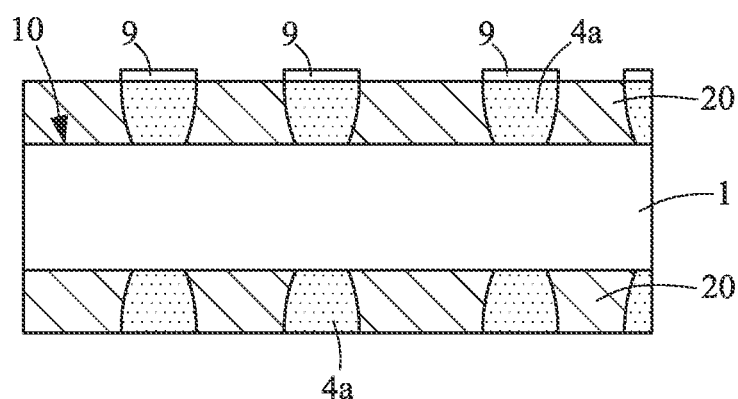
Figure 3F:
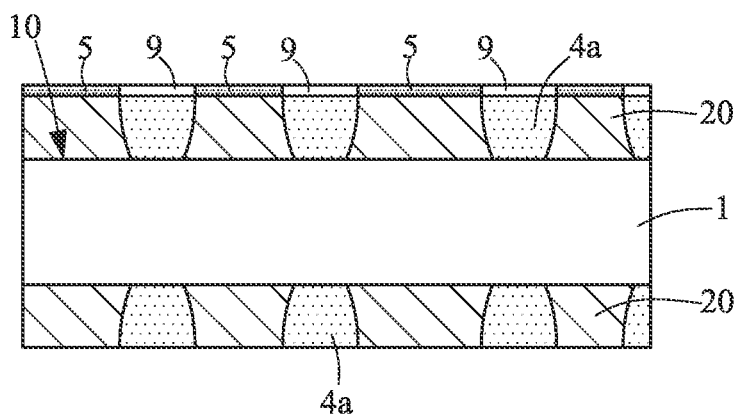

On the basis of FIG. 3E, an adhesive layer 9 is coated on the dielectric material 4a on the first surface 10. The material of the adhesive layer 9 is mainly resin, epoxy resin or other non-conductive adhesive materials. According to FIG. 3F, a conductive glue 5 is coated on the first trace 20 of the first surface 10, wherein the conductive glue 5 is, for example, Cu paste. In this embodiment, the conductive adhesive 5 can be coated on the first trace 20 by printing.

Figure 3G:
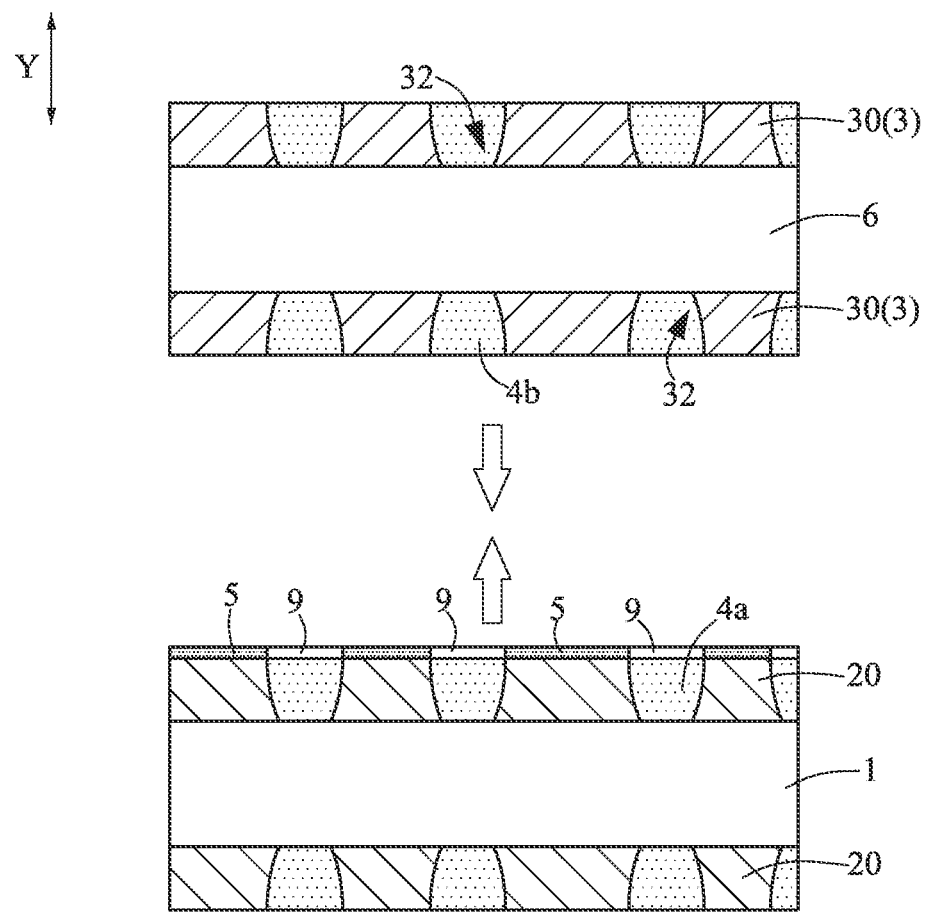

Referring to FIG. 3G, a second substrate 6 is provided, and a second circuit layer 3 is formed on two surfaces of the second substrate 6 respectively, wherein the two surfaces are corresponding to each other. In addition, the second circuit layer 3 has a plurality of second traces 30 formed by etching, and a second gap 32 is beside the second trace 30 and made by etching, wherein an etching factor of the second trace 30 is greater than or equal to 2.3. The second gap 32 is filled with a dielectric material 4b. For the embodiment, the method for forming the second trace 30, the second gap 32 and the dielectric material 4b on the second substrate 6 is the same as the method for forming the first trace 20, the first gap 22 and the dielectric material 4a on the first substrate 1. Therefore, the descriptions for forming the second trace 30, the second gap 32 and the dielectric material 4b may not be discussed any further hereinafter.

With reference to FIG. 3G, the second trace 30 on one of the two surfaces of the second substrate 6 and the first trace 20 on one of the two surfaces of the first substrate 1 are jointed along an X-axis by means of the adhesive layer 9 and the conductive glue 5. The first gap 22 and the second gap 32 are corresponding to each other while in combination, and so do the first trace 20 and the second trace 30, wherein the combination for the second trace 30 and the first trace 20 is executed under a certain temperature, in order to cure the adhesive layer 9 and the conductive glue 5.

Figure 3H:
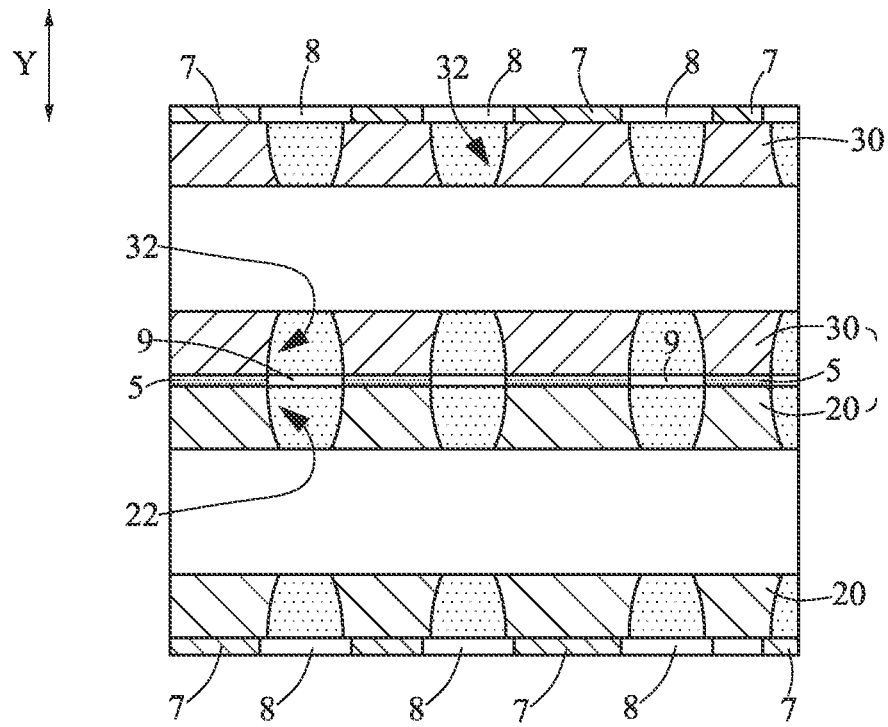

Referring to FIG. 3H, to combine the second trace 30, the conductive glue 5 and the first trace 20 is to form a stacked trace 40. Since the etching factors of the first trace 20 and the second trace 30 both are greater than or equal to 2.3, the etching factor of the stacked trace 40, combining the first trace 20 with the second trace 30 along the X-axis, is greater than or equal to 4.6 as well. After producing the stacked trace 40, an outer surface of the second trace 30 of another outer surface of the second substrate 6 and an outer surface of the first trace 20 of another outer surface of the first substrate 1 can also be applied by a surface treatment process. For the embodiment, the surface treatment process is to add a surface protection layer 7 and a solder mask ink 8.

According to aforesaid, the printed circuit board 300 is completely produced, and the trace (the stacked trace 40) of the printed circuit board 300 is with a higher etching factor. Compared with the second embodiment, the third embodiment adopts the conductive glue 5 to combine the second circuit layer 3 with the first circuit layer 2, but not the low-temperature Cu—Cu direct bonding technique. More, a planarization technique as chemical mechanical polishing technique may not be necessary to the third embodiment. Since the two conductive layers (the first circuit layer 2 and the second circuit layer 3) are etched individually in the third embodiment, the printed circuit board 300 with the traces of a higher etching factor is obtained.

As above embodiment, both the first surface 10 and the second surface 12 of the first substrate 1 are disposed the first conductive layer 2 respectively. On the other hand, only one surface (the first surface 10 or the second surface 12) disposed the first conductive layer 2 is another option.

Figure 4:
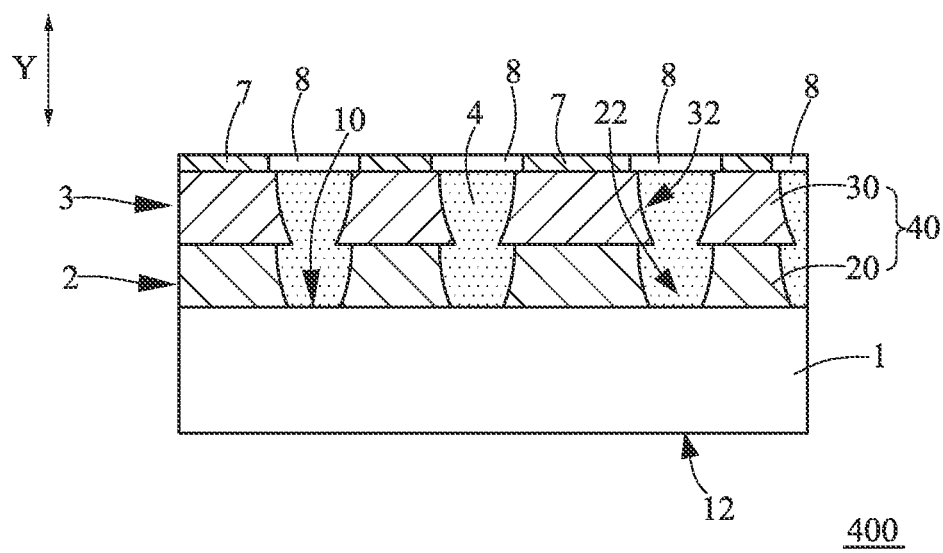
FIG. 4 illustrates a schematic view of a fourth embodiment of the printed circuit board of the present disclosure.

Please refer to FIG. 4, which illustrate a schematic view of a fourth embodiment of the printed circuit board of the present disclosure. In the embodiment, the printed circuit board 400 includes a first substrate 1, a first circuit layer 2 and a second circuit layer 3, wherein the first substrate 1 includes a first surface 10 and a second surface 20, the first surface 10 and the second surface 20 are corresponding to each other along an Y-axis. The first circuit layer 2 forms on the first surface 10 of the first substrate 1, and has at least one first trace 20 (multiple for the fourth embodiment). At least one first gap 22 (multiple for the fourth embodiment) is beside the first trace 20 and made by etching. Further, an etching factor of the first trace 20 is greater than or equal to 2.3. Additionally, the second circuit layer 3 is formed on the first circuit layer 2, wherein the second circuit layer 3 has at least one second trace 30 (multiple for the fourth embodiment), the second trace 30 has at least one second gap 32 (multiple for the fourth embodiment), and an etching factor of the second trace 30 is greater than or equal to 2.3. More, the first gap 22 and the second gap 32 are through to each other along the Y-axis, and the first gap 22 and the second gap 32 are filled with the dielectric material 4. Further, the first trace 20 and the second trace 30 are combined with each other along the Y-axis, so as to form a stacked trace 40, wherein an etching factor of the stacked trace 40 is greater than or equal to 4.6. In addition, a surface protection layer 7 and a solder mask ink 8 form on an outer surface of the dielectric material 4 and the stacked trace 40. The surface protection layer 7 is disposed on the stacked trace 40, and the solder mask ink 8 is disposed on the dielectric material 4, especially the solder mask ink 8 covers the partial stacked trace 40. The method for manufacturing the printed circuit board 400 is almost the same as the method for manufacturing the printed circuit board 100, as shown from FIG. 1A to FIG. 1G. The main difference is as follows: there is no need to produce any component on the second surface 12 while manufacturing the printed circuit board 400. However, the method for manufacturing the printed circuit board 400 may not be discussed any further hereinafter.

As a conclusion, while manufacturing the printed circuit boards of the present disclosure, since the conductive layers are etched individually, the printed circuit board with the traces of a higher etching factor is then obtained. For those embodiments as aforesaid, the first gap 22 and the second gap 32 both are filled with the dielectric material 4, in order to increase the insulation among the stacked conductors 40; on the other hand, a person having ordinary skill in the art may have other options that the first gap 22 and the second gap are not filled with the dielectric material 4, but somewhere else.

Although the disclosure has been disclosed and illustrated with reference to particular embodiments, the principles involved are susceptible for use in numerous other embodiments that will be apparent to a person having ordinary skill in the art. This disclosure is, therefore, to be limited only as indicated by the scope of the appended claims.

What is claimed is:

1. A printed circuit board comprising:
   a first substrate having a first surface and a second surface, the first surface and the second surface being parallel to each other relative to an axis;
   a first circuit layer formed on at least one of the first surface and the second surface of the first substrate, the first circuit layer having a first trace and a first gap beside the first trace by etching, wherein an etching factor of the first trace is greater than or equal to 2.3; and
   a second circuit layer formed on the first circuit layer, the second circuit layer disposed on a surface of a second substrate, the second circuit layer having a second trace and a second gap beside the second trace by etching, wherein an etching factor of the second trace is greater than or equal to 2.3;
   wherein the first trace and the second trace are connected with each other along the axis in order to form a stacked trace, and an etching factor of the stacked trace is greater than or equal to 4.6;
   wherein a low-temperature Cu-Cu direct bonding technique is applied to a connection of the first trace and the second trace.

2. The printed circuit board according to claim 1, wherein the first gap and the second gap are through to each other along the axis, and the first gap and the second gap are filled with a dielectric material.

3. The printed circuit board according to claim 1, wherein a planarization technique is included to apply to the connection of the first trace and the second trace.

4. The printed circuit board according to claim 3, wherein the planarization technique is a chemical mechanical polishing technique.

5. The printed circuit board according to claim 1, wherein an solder mask ink is formed by at least one of an outer surface of the second circuit layer or the stacked trace.

6. A method for manufacturing a printed circuit board, comprising:
   providing a first substrate having a first surface and a second surface, the first surface and the second surface being parallel to each other relative to an axis;
   providing a first circuit layer formed on at least one of the first surface and the second surface of the first substrate, wherein the first circuit layer has a first trace and a first gap beside the first trace by etching, wherein an etching factor of the first trace is greater than or equal to 2.3;
   forming a second circuit layer on the first circuit layer, wherein the second circuit layer is disposed on a surface of a second substrate, wherein the second circuit layer has a second trace and a second gap beside the second trace by etching, wherein an etching factor of the second trace is greater than or equal to 2.3; and forming a stacked trace by way of the first trace and the second trace being connected with each other along the axis, and an etching factor of the stacked trace being greater than or equal to 4.6;

wherein a low-temperature Cu-Cu direct bonding technique is applied to a connection of the first trace and the second trace.

7. The method for manufacturing the printed circuit board according to claim 6, wherein the first gap and the second gap are through to each other along the axis, and the first gaps and the second gaps are filled with a dielectric material.

8. The method for manufacturing the printed circuit board according to claim 6, wherein a planarization technique is included to apply to the connection of the first trace and the second trace.

9. The method for manufacturing the printed circuit board according to claim 8, wherein the planarization technique is a chemical mechanical polishing technique.

10. The method for manufacturing the printed circuit board according to claim 6 further comprising a step of performing a surface treatment process to at least one of an outer surface of the second circuit layer and the stacked trace.

\* \* \* \* \*